United States Patent
Chen et al.

(10) Patent No.: US 8,332,416 B2
(45) Date of Patent: Dec. 11, 2012

(54) SPECIFICATION ESTABLISHING METHOD FOR CONTROLLING SEMICONDUCTOR PROCESS

(75) Inventors: Cheng-Hao Chen, Taipei (TW); Yun-Zong Tian, Taichung County (TW); Shih-Chang Kao, Kaohsiung (TW); Yij Chieh Chu, Taipei County (TW); Wei Jun Chen, Taichung County (TW)

(73) Assignee: Inotera Memories, Inc., Taoyuan County (TW)

( * ) Notice: Subject to any disclaimer, the term of this patent is extended or adjusted under 35 U.S.C. 154(b) by 101 days.

(21) Appl. No.: 13/004,236

(22) Filed: Jan. 11, 2011

(65) Prior Publication Data
US 2012/0102052 A1 Apr. 26, 2012

(30) Foreign Application Priority Data
Oct. 20, 2010 (TW) .................... 99135793 A

(51) Int. Cl.
G06F 7/00 (2006.01)
G06F 17/30 (2006.01)
(52) U.S. Cl. ........ 707/754; 707/710; 707/737; 707/738; 707/739; 707/740; 707/771

(58) Field of Classification Search .............. None
See application file for complete search history.

(56) References Cited

U.S. PATENT DOCUMENTS

| | | | | |
|---|---|---|---|---|
| 2003/0079160 | A1* | 4/2003 | McGee et al. | 714/39 |
| 2008/0114564 | A1* | 5/2008 | Ihara | 702/158 |
| 2011/0190919 | A1* | 8/2011 | Kiermasz | 700/110 |

* cited by examiner

*Primary Examiner* — Tony Mahmoudi
*Assistant Examiner* — Yu Zhao
(74) *Attorney, Agent, or Firm* — Rosenberg, Klein & Lee

(57) ABSTRACT

A specification establishing method for controlling semiconductor process, the steps includes: sampling a plurality of sample groups from a population, each sample group being a non-normal distribution; filtering the sample groups; summarizing the filtered sample groups to form a non-normal distribution diagram; getting a value-at-risk and a median by calculating from the non-normal distribution diagram; getting a critical value by calculating the value-at-risk and the median with a critical formula; getting a plurality of state values by calculating the filtered sample groups with a proportion formula; and getting an index value by calculating the non-normal distribution diagram with the proportion formula. Thus, the state values indicate the states of the sample groups are abnormal or not by comparing the state values to the index value.

15 Claims, 3 Drawing Sheets

SPECIFICATION ESTABLISHING METHOD FOR CONTROLLING SEMICONDUCTOR PROCESS

BACKGROUND OF THE INVENTION

1. Field of the Invention

The instant disclosure relates to a specification establishing method for controlling semiconductor process; in particular, a specification establishing method applied on a non-normal distribution group of semiconductor process.

2. Description of Related Art

Statistical Process Control, or SPC, is a process control tool by mathematical and statistical method. The index of SPC (such as $C_p$, $C_{pk}$ or $C_{pmk}$) is established with the normal distribution data. SPC is usually used to analyze and evaluate a production process by feedback signals in order to find a system factor, so that the user can take some measures to eliminate the effect of the system factor. Thus, the production process is under control and influenced by a random factor only.

However, for the wafer production plant, when establishing a control mechanism for (wafer), SPC can not be applied on the production process of the new product, because test data of the new product always present a non-normal distribution.

Therefore, one aspect of the instant disclosure is to provide a specification establishing method for controlling semiconductor process that addresses the aforementioned problem.

SUMMARY OF THE INVENTION

The main object of the instant disclosure is to provide a specification establishing method for controlling semiconductor process, wherein the method has a plurality of state values and an index value, the state values present the states of the semiconductor process is abnormal or not by comparing the state values to the index value.

The specification establishing method for controlling semiconductor process in accordance with the instant disclosure comprises the steps of: providing a database and choosing a population from the database; sampling a plurality of sample groups from the population, each sample group being a non-normal distribution and having a plurality of samples; filtering the sample groups; summarizing the filtered sample groups to form a non-normal distribution diagram; getting a value-at-risk and a median by calculating from the non-normal distribution diagram; getting a critical value by calculating the value-at-risk and the median with a critical formula; getting a plurality of state values by calculating the filtered sample groups with a proportion formula; and getting an index value by calculating the non-normal distribution diagram with the proportion formula; thereby the state values present the states of the sample groups are abnormal or not by comparing the state values to the index value.

The specification establishing method for controlling semiconductor wafer process in accordance with the instant disclosure comprises the steps of: providing a non-normal distribution population; sampling at least two sample groups from the population, each sample group has a plurality of samples; filtering the selected sample groups; summarizing the at least two filtered sample groups to get a value-at-risk; getting a critical value by calculating the value-at-risk; getting a plurality of state values by calculating the at least two filtered sample groups with a proportion formula; and getting an index value by calculating the at least two summarized sample groups with the proportion formula; thereby the state values present the states of the sample groups is abnormal or not by comparing the state values to the index value.

The instant disclosure provides several advantages. First, the index value of the instant disclosure is suitable for non-normal data distribution. Second, the instant disclosure has higher sensitivity relative to SPC when the data distribution is non-normal.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

Figure 1:
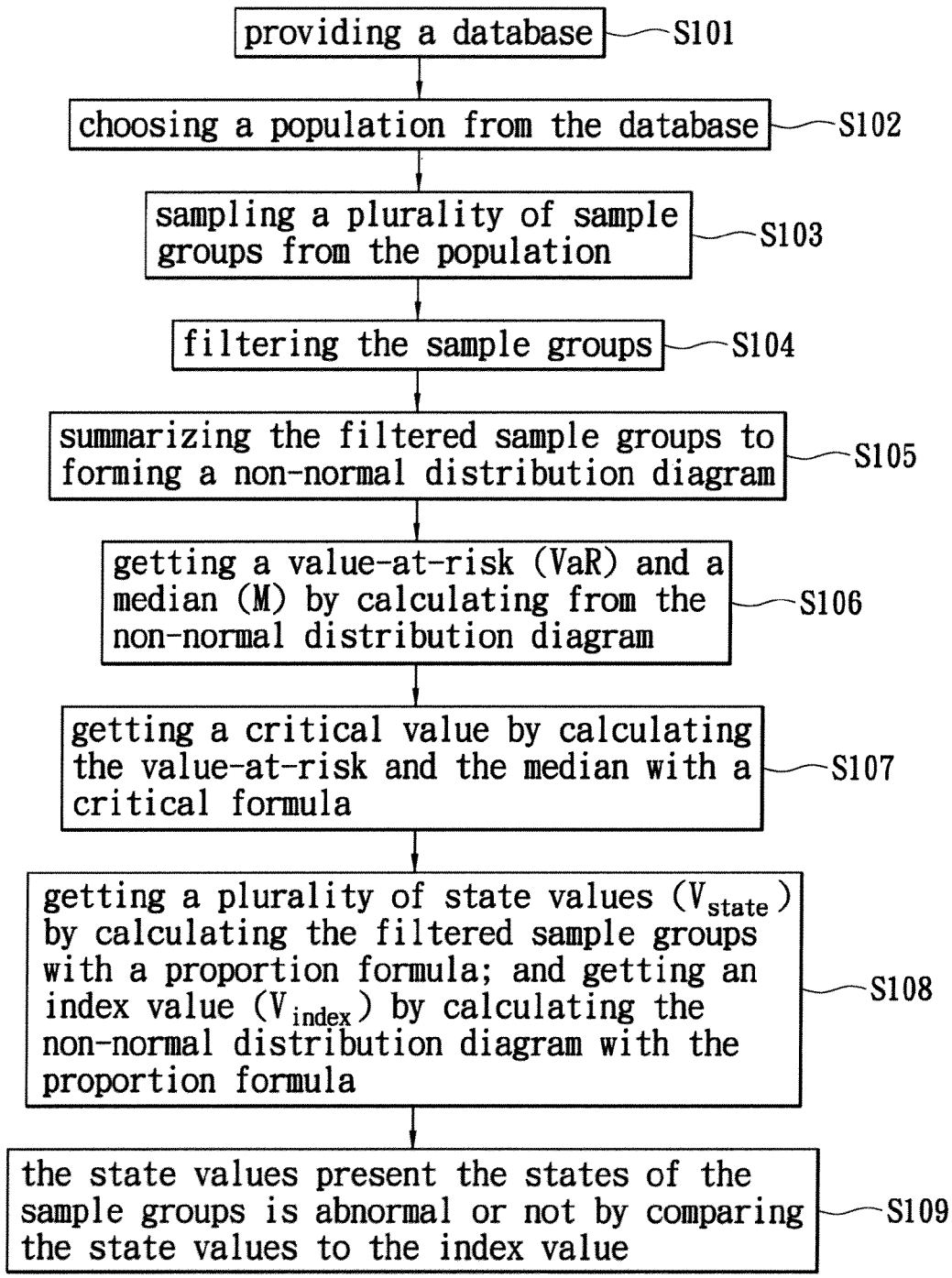
FIG. 1 is a flow diagram illustrating the specification establishing method of the instant disclosure.

Please refer to FIG. 1, which shows the steps of a specification establishing method for controlling semiconductor process, and the specification establishing method can be limited for controlling semiconductor wafer process. The steps of the specification establishing method as follows.

S101: providing a database. The database can be a data group of wafer process.

S102: choosing a population from the database. The population can be a defect group or a yield group, and the population is a non-normal distribution.

S103: sampling a plurality of sample groups from the population. Each sample group is a non-normal distribution and having a plurality of samples, wherein the sample groups are a plurality of sample groups of different equipments. Besides, numbers of the sample groups is more than two.

S104: filtering the sample groups. Noise of the sample groups and samples having extreme values can be filtered out.

S105: summarizing the filtered sample groups to form a non-normal distribution diagram. The non-normal distribution diagram can be a beta distribution diagram. In other words, the step S105 uses summarized sample groups to get parameters α and β by Maximum Likelihood Estimation, and then forming the non-normal distribution diagram to reflect the real condition.

S106: getting a value-at-risk (VaR) and a median (M) by calculating from the non-normal distribution diagram. The value-at-risk can be obtained by an semi-parametric method for VaR estimation, which is established by Danielsson and de Vries in 1997. Namely, the tails of the non-normal distribution diagram is used to estimate a tail parameter $\lambda$. After confirming the tail parameter $\lambda$, the value-at-risk can be obtained by a formula as:

$$VaR = X_{N+1}\left(\frac{N}{T\alpha}\right)^{1-\lambda},$$

wherein $X_{N+1}$ is an initial value of the tail portion of the non-normal distribution diagram, N is an arbitrary number of the observations of tail portion of the non-normal distribution diagram, $\alpha$ is a level of significance, and T is the number of all observations.

S107: getting a critical value by calculating the value-at-risk and the median with a critical formula. The critical formula is:

$$\frac{VaR + M}{n} = V_{cri}(n \in R, n > 0),$$

wherein VaR is the value-at-risk, M is the median, $V_{cri}$ is the critical value, and the preferred value of n is 2.

S108: getting a plurality of state values ($V_{state}$) by calculating the filtered sample groups with a proportion formula, where the state value shows the present condition of the respective sample group; and getting an index value ($V_{index}$) by calculating the non-normal distribution diagram with the proportion formula. The proportion formula is:

$$\frac{H_{cri}}{H_{cri} + L_{cri}} = V \ (V = V_{state} \text{ or } V_{index})$$

or $$\frac{L_{cri}}{H_{cri} + L_{cri}} = V \ (V = V_{state} \text{ or } V_{index}),$$

wherein $H_{cri}$ is the number of filtered samples or filtered samples summarized in the non-normal distribution diagram with values higher than the critical value, $L_{cri}$ is the number of filtered samples with values lower than the critical value, $V_{state}$ is the state value, and $V_{index}$ is the index value.

S109: the state values and the index value can be integrated to form a Single Warning Score (SWS) diagram. The state values present the states of the sample groups is abnormal or not by comparing the state values to the index value. Thus, the SWS diagram can present the abnormal sample groups which need adjustment.

In addition, for the step S105 of the present embodiment, the filtered sample groups are summarized into a non-normal distribution diagram, which is used in ensuing steps. However, in practice, the filtered sample groups can be summarized and used directly to compute the value at risk, without using a non-normal distribution diagram. Besides, the median of the critical formula can be replaced by other suitable parameters.

Figure 2:
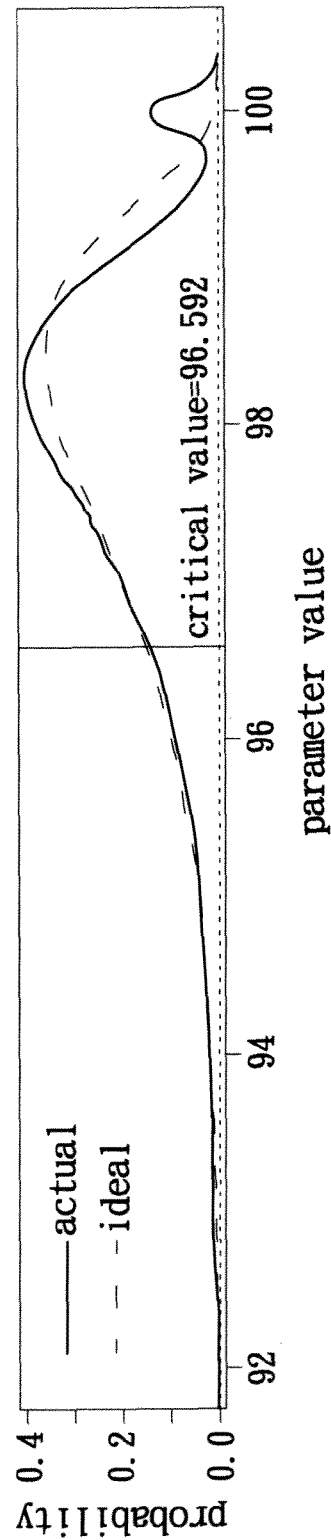
FIG. 2 is a distribution diagram illustrating the sample groups after filtering and summarizing of the instant disclosure.
Figure 3:
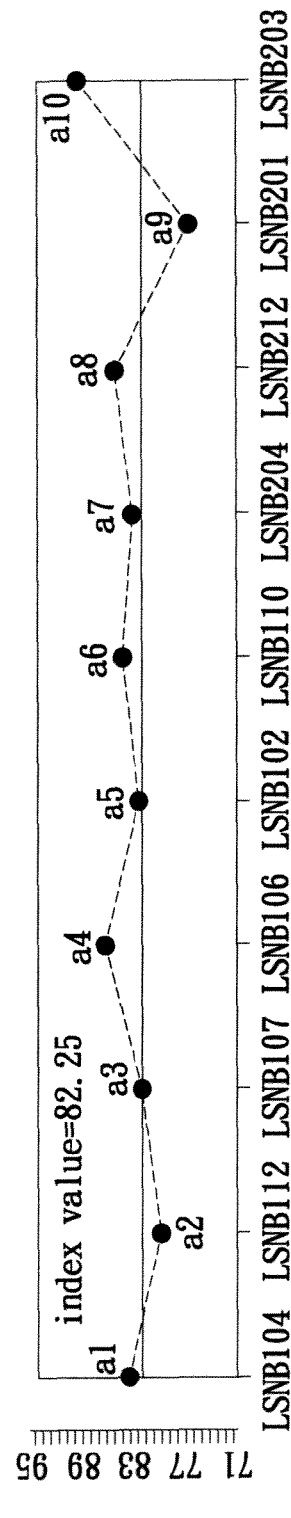
FIG. 3 is a specification diagram illustrating the single warning score of the sample groups of the instant disclosure.

Please refer to FIGS. 2 and 3, which show the second embodiment of the instant disclosure. The second embodiment is an application of the first embodiment.

As shown in FIG. 2, FIG. 2 shows a non-normal distribution diagram summarized from a plurality of sample groups of different equipments. The serial numbers of the equipments are LSNB104, LSNB112, LSNB107, LSNB106, LSNB102, LSNB110, LSNB204, LSNB212, LSNB201, and LSNB203. The dotted line of FIG. 2 represents an ideal non-normal distribution curve summarized form the sample groups of different equipments. The continuous line of FIG. 2 represents the actual non-normal distribution curve summarized from the filtered sample groups of different equipments, wherein the actual non-normal distribution curve is near the ideal non-normal distribution curve by filtering the sample groups of different equipments before summarizing.

Getting a value at risk and a median from the actual non-normal distribution curve, and setting n equals to 2. Taking the value at risk, the median and n into the critical formula to obtain a critical value to be 96.592.

Thereafter, respectively taking the sample groups of different equipments into the proportion formula to obtain several state values (a1~a10), and taking the actual non-normal distribution curve into the proportion formula to obtain an index value (82.25). Furthermore, summarizing the index value and the state values to form a Single Warning Score diagram (as FIG. 3 shown). Therefore, the user can rapidly find a2 and a9 are lower than the index value, so that the corresponding equipments LSNB112 and LSNB201 are in abnormal state and need to be adjusted.

Figure 4:
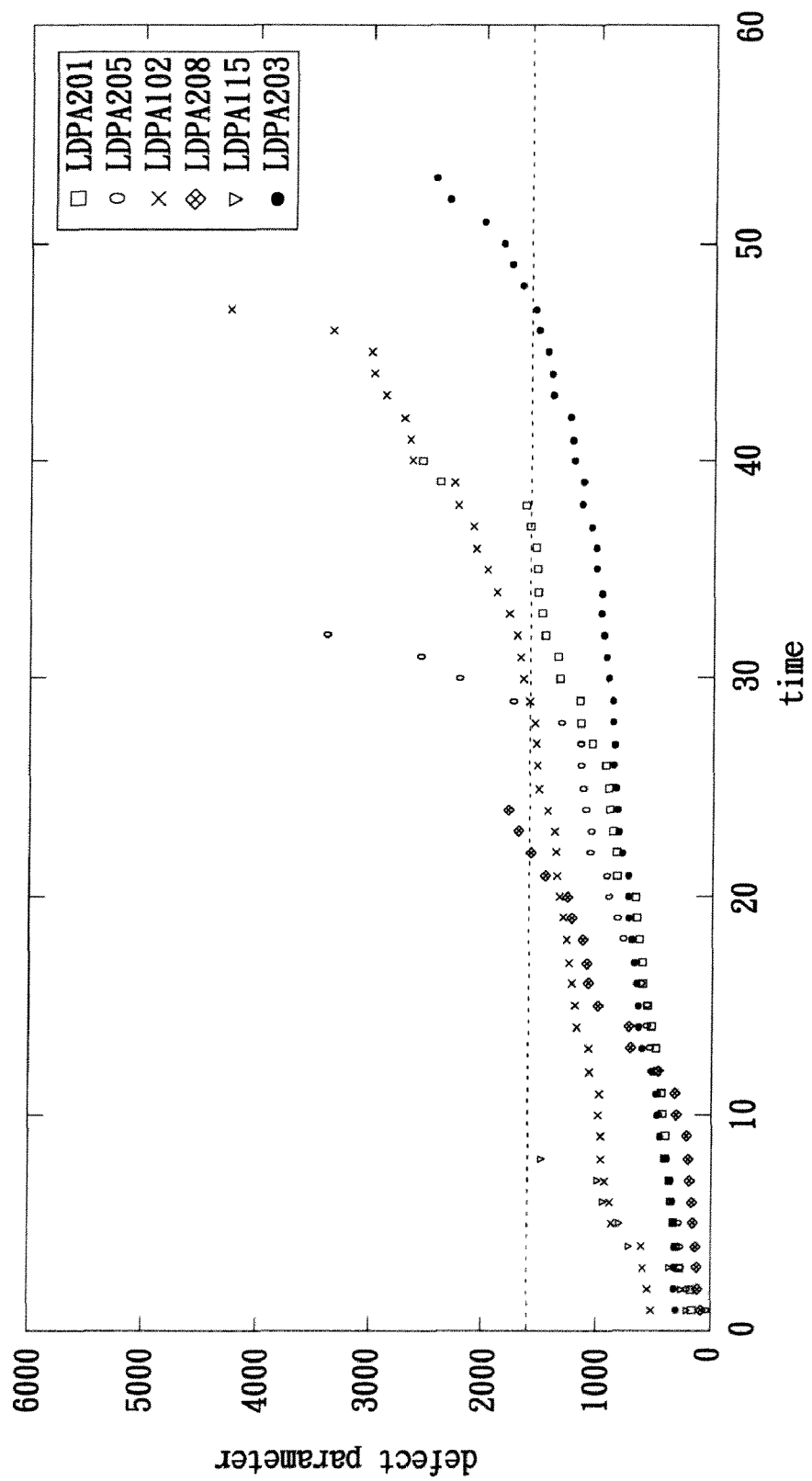
FIG. 4 is a distribution diagram illustrating defects of the sample groups of the instant disclosure.

Please refer to FIG. 4, which show the third embodiment of the instant disclosure. The third embodiment is an application of the first embodiment.

FIG. 4 shows a defect distribution diagram of a plurality of sample groups of different equipments, the sample groups of different equipments were chosen from a defect group, and the serial numbers of the equipments are LDPA102, LDPA115, LDPA201, LDPA203, LDPA205, and LDPA208. And then, calculating and summarizing the defect distribution diagram to get a table as follows.

| serial number | Amount | average | error | median | min | max | $C_{pmk}$ | SWS |
|---|---|---|---|---|---|---|---|---|
| LDPA102 | 47 | 1631.79 | 806.25 | 1432 | 509 | 4263 | 0.446 | 63.044 |
| LDPA115 | 8 | 705.75 | 440.735 | 750 | 177 | 1477 | 1.263 | 100 |
| LDPA201 | 40 | 888.725 | 583.251 | 752 | 141 | 2554 | 0.956 | 92.5 |
| LDPA203 | 53 | 948.415 | 518.18 | 851 | 288 | 2438 | 0.904 | 88.6792 |
| LDPA205 | 31 | 790.129 | 578.031 | 601 | 22 | 2555 | 1.08 | 87.5 |
| LDPA208 | 24 | 701.333 | 587.56 | 563.5 | 63 | 1786 | 1.208 | 91.667 |

Letting $C_{pmk}$ of SPC to be a judging basis for determining the state of process is abnormal or not, $C_{pmk}$ (1.08) of equipment LDPA205 is larger than 1, and $C_{pmk}$ (0.956) of equipment LDPA201 is smaller than 1, so that only equipment LDPA201 needs to be adjusted immediately.

However, equipment LDPA205 has more samples with values higher than equipment LDPA201 according to FIG. 4. The equipment LDPA 205 needs to be adjusted more urgently than equipment LDPA 201, but the equipment LDPA 205 is not regarded as needing to be adjusted immediately by $C_{pmk}$. Thus, $C_{pmk}$ can not represent the actual state accurately.

By letting SWS to be a judging basis for determining the state of process is abnormal or not, the state value of the equipment LDPA205 is 87.5, and the state value of the equipment LDPA201 is 92.5, so that the equipment LDPA205 needs to be adjusted more urgently than the equipment LDPA 201. Therefore, SWS can represent more accurately the real state than SPC and closer to the real condition than SPC.

Please refer to the following table, which shows the fourth embodiment of the instant disclosure. The fourth embodiment is an application of the first embodiment.

| process type | population | real abnormal equipment number | warning equipment number | catch rate |
|---|---|---|---|---|
| CMP | yield | 5 | 2 | 40% |
| ETCH | yield | 6 | 4 | 67% |
| PHOTO | yield | 3 | 1 | 34% |
| T/F | yield | 2 | 1 | 50% |
| WET | yield | 3 | 2 | 67% |

See the above table, which is a summarized table with SWS applied to several wafer processes, such as CMP, ETCH, PHOTO, T/F, and WET. In other words, respectively taking five field groups from the databases of the above five wafer processes. And then, carrying out the steps S101~S109 to get a warning equipment number, where the warning equipment number is the number of the state values lower than the index value. A catch rate is obtained via dividing the warning equipment number by the real abnormal equipment number.

Furthermore, for different processes and problems, the appropriate index value can be determined by the technical knowledge of the experts and computerized simulations, thereby improving the catch rate.

The instant disclosure provides several advantages. First, when the data distribution is non-normal, the index value of the instant disclosure is more suitable than the index values of the SPC (such as $C_p$, $C_{pk}$ or $C_{pmk}$). Second, when the data distribution is non-normal, the instant disclosure has higher sensitivity than SPC. Because the specification of SPC is established too loosely from accurately detecting the abnormal state (as FIG. 4 shown).

The description above only illustrates specific embodiments and examples of the instant disclosure. The instant disclosure should therefore cover various modifications and variations made to the herein-described structure and operations of the instant disclosure, provided they fall within the scope of the instant disclosure as defined in the following appended claims.

What is claimed is:

1. A specification establishing method for controlling semiconductor process, comprising the steps of:
   providing a database and choosing a population from the database;
   sampling a plurality of sample groups from the population, each sample group being a non-normal distribution and having a plurality of samples;
   filtering the sample groups;
   summarizing the filtered sample groups to form a non-normal distribution diagram;
   getting a value-at-risk and a median by calculating from the non-normal distribution diagram;
   getting a critical value by calculating the value-at-risk and the median with a critical formula;
   getting a plurality of state values by calculating the filtered sample groups with a proportion formula; and
   getting an index value by calculating the non-normal distribution diagram with the proportion formula;
   thereby the state values present the states of the sample groups are abnormal or not by comparing the state values to the index value,
wherein the critical formula is $$\frac{VaR + M}{n} = V_{cri} (n \in R, n > 0),$$

VaR is the value-at-risk, M is the median and $V_{cri}$ is the critical value.

2. The specification establishing method as claimed in claim 1, wherein the database is a data group of wafer process.

3. The specification establishing method as claimed in claim 1, wherein the population is a defect group or a yield group.

4. The specification establishing method as claimed in claim 1, wherein the sample groups are a plurality of sample groups of different equipments.

5. The specification establishing method as claimed in claim 1, wherein the non-normal distribution diagram is a beta distribution diagram.

6. The specification establishing method as claimed in claim 1, further limited for controlling semiconductor wafer process.

7. A specification establishing method for controlling semiconductor wafer process, comprising the steps of:
   providing a non-normal distribution population;
   sampling at least two sample groups from the population, each sample group has a plurality of samples;
   filtering the at least two sample groups;
   summarizing the at least two filtered sample groups to get a value-at-risk;
   getting a critical value by calculating the value-at-risk;
   getting a plurality of state values by calculating the at least two filtered sample groups with a proportion formula; and
   getting an index value by calculating the at least two summarized sample groups with the proportion formula;
   thereby the state values present the states of the sample groups are abnormal or not by comparing the state values to the index value,
wherein the proportion formula is $$\frac{H_{cri}}{H_{cri} + L_{cri}} = V \ (V = V_{state} \text{ or } V_{index})$$

or $$\frac{L_{cri}}{H_{cri} + L_{cri}} = V \ (V = V_{state} \text{ or } V_{index}),$$

$H_{cri}$ is the number of samples with values higher than the critical value, $L_{cri}$ is the number of samples with values lower than the critical value, $V_{state}$ is the state value, and $V_{index}$ is the index value.

8. The specification establishing method as claimed in claim 7, wherein the population is a defect group or a yield group.

9. The specification establishing method as claimed in claim 7, wherein the sample groups are a plurality of sample groups of different equipments.

10. A specification establishing method for controlling semiconductor process, comprising the steps of:
   providing a database and choosing a population from the database;
   sampling a plurality of sample groups from the population, each sample group being a non-normal distribution and having a plurality of samples;
   filtering the sample groups;
   summarizing the filtered sample groups to form a non-normal distribution diagram;
   getting a value-at-risk and a median by calculating from the non-normal distribution diagram;
   getting a critical value by calculating the value-at-risk and the median with a critical formula;
   getting a plurality of state values by calculating the filtered sample groups with a proportion formula; and
   getting an index value by calculating the non-normal distribution diagram with the proportion formula;
   thereby the state values present the states of the sample groups are abnormal or not by comparing the state values to the index value,
wherein the proportion formula is $$\frac{H_{cri}}{H_{cri}+L_{cri}} = V \ (V = V_{state} \text{ or } V_{index})$$

or $$\frac{L_{cri}}{H_{cri}+L_{cri}} = V \ (V = V_{state} \text{ or } V_{index}),$$

$H_{cri}$ is the number of samples with values higher than the critical value, $L_{cri}$ is the number of samples with values lower than the critical value, $V_{state}$ is the state value, and $V_{index}$ is the index value.

11. The specification establishing method as claimed in claim 10, wherein the database is a data group of wafer process.

12. The specification establishing method as claimed in claim 10, wherein the population is a defect group or a yield group.

13. The specification establishing method as claimed in claim 10, wherein the sample groups are a plurality of sample groups of different equipments.

14. The specification establishing method as claimed in claim 10, wherein the non-normal distribution diagram is a beta distribution diagram.

15. The specification establishing method as claimed in claim 10, further limited for controlling semiconductor wafer process.

* * * * *